United States Patent [19]

Logar

[11] Patent Number: 4,728,389

[45] Date of Patent: Mar. 1, 1988

[54] PARTICULATE-FREE EPITAXIAL PROCESS

[75] Inventor: Roger E. Logar, San Jose, Calif.

[73] Assignee: Applied Materials, Inc., Santa Clara, Calif.

[21] Appl. No.: 735,556

[22] Filed: May 20, 1985

[51] Int. Cl.[4] .................. C30B 23/06; C30B 25/10; B08B 3/12; B32B 3/02

[52] U.S. Cl. .................................. 156/612; 156/613; 156/DIG. 73; 134/1; 361/212; 427/55; 427/255.1; 437/173; 437/225

[58] Field of Search ............... 156/613, DIG. 73, 611, 156/612; 427/55, 51, 86, 255.1; 361/212, 213; 134/1

[56] References Cited

U.S. PATENT DOCUMENTS

| | | | |
|---|---|---|---|
| 3,424,615 | 1/1969 | Eichorn | 134/1 |
| 3,615,813 | 10/1971 | Clarke et al. | 361/212 |
| 4,081,313 | 3/1978 | McNeilly et al. | 427/55 |
| 4,115,163 | 9/1978 | Gorina et al. | 427/55 |
| 4,121,947 | 10/1978 | Hemphill | 134/1 |
| 4,132,567 | 1/1979 | Blackwood | 134/1 |
| 4,233,386 | 11/1980 | Aizawa et al. | 134/1 |
| 4,468,283 | 8/1984 | Ahmed | 156/DIG. 89 |
| 4,500,564 | 2/1985 | Enomoto | 134/1 |
| 4,518,455 | 5/1985 | Muething | 156/613 |
| 4,560,417 | 12/1985 | Bardina et al. | 134/1 |
| 4,576,698 | 3/1986 | Gallagher et al. | 134/1 |
| 4,579,080 | 4/1986 | Martin et al. | 118/730 |
| 4,579,609 | 4/1976 | Reif et al. | 156/612 |

Primary Examiner—Gary P. Straub
Attorney, Agent, or Firm—Flehr, Hohbach, Test, Albritton & Herbert

[57] ABSTRACT

Particles and particle-generated defects during epitaxial deposition are substantially decreased by the process of controlling the various particle transport mechanisms, such as, for example, by applying low level radiant energy during cold purge cycles in barrel reactors.

19 Claims, 6 Drawing Figures

NO GAS FLOW OR LOW GAS FLOW

STANDARD TO HIGH FLOW ATMOSPHERIC PRESSURE

COMBINATION OF REDUCED PRESSURE AND HIGHER FLOWS

PARTICULATE-FREE EPITAXIAL PROCESS

BACKGROUND OF THE INVENTION

This invention relates generally to reactor processes for forming layers of material on substrates such as semiconductor wafer substrates, using gas chemistry and heating techniques such as radiant heating and induction heating.

In particular, the present invention relates to the chemical epitaxial deposition of a layer on semiconductor substrate wafers and to a process for forming epitaxial layers which are substantially free of particles and particle-related defects.

As measured by minimum feature size and device density, the scale of integration of semiconductor devices on integrated circuit chips (IC) has been improved greatly since the middle and late 1970's. In fact, over the past five years, the silicon IC technology has grown from large scale integration (LSI) to very large scale integration (VLSI), and is projected to grow to ultra-large scale integration (ULSI) by the end of the decade of the 1980's. This continuing improvement in silicon integrated circuit integration has been made possible by advances in integrated circuit manufacturing equipment, as well as in the materials and methods utilized in processing semiconductor wafers into IC chips. Some of the most dramatic advances in manufacturing equipment have involved improved apparatus for lithography and etching. Generally, the density of integrated circuits and their speed of operation are dependent upon the accuracy and resolution of the lithography and etching apparatus used to form patterns of circuit elements in masking layers on the semiconductor wafer. An equally important aspect of semiconductor IC manufacture is the ability to consistently achieve a high yield of good working IC devices on the semiconductor substrate wafer.

The implementation of epitaxial layers, both homo-epitaxial and heteroepitaxial layers, on an underlying substrate layer has a great impact on the yields of the associated IC wafers. A primary example is the growth of epitaxial silicon on a semiconductor wafer substrate. Growth of an epitaxial silicon layer is typically performed in a chemical vapor deposition process in which the wafers are heated while a gaseous silicon compound is passed over the wafer to effect pyrolysis or decomposition. Epitaxial deposition in general and silicon epitaxial deposition in particular are integral parts of VLSI processing, especially for the advanced bipolar, NMOS and CMOS technologies, and for future advanced technologies such as ULSI, since many of the components of the individual transistors and devices are formed in an epitaxial layer.

The ability to process good quality advanced NMOS, CMOS and bipolar IC chips using epitaxy is strongly dependent on maintaining a substantially defect-free state (1) for the bulk semiconductor wafer and for the surface of the bulk wafer, and (2) during the step of depositing the epitaxial silicon layer. Simply put, and as discussed below, elimination of both sub-surface and surface defects is crucial to obtaining good yields in current and future technologies, particularly as those technologies progress toward a minimum device feature size of one micron and smaller.

Surface defects are usually related to particles and induce lithographic patterning defects. This is extremely critical for minimum device feature sizes of one micron and below and for large chip areas, since a single lithographic defect in such devices can cause non-functionality of the device and as few as one defect per square centimeter (about 80 defects per four inch wafer) can have catastrophic effects on wafer processing yields. It is a characteristic of epitaxial processing that the crystallographic nature and defect level of the deposited epitaxial layer or epi layer usually reflects the parent or bulk substrate wafer. Thus, for example, stacking faults on the substrate can give rise to epitaxial stacking faults, and dislocations in the substrate can be transmitted through the epi layer. In addition, epitaxial defects such as pits, hillocks and microcontamination result from the bulk substrate wafer surface particles. As a consequence, even where the parent substrate is substantially defect-free (the introduction of substantially defect-free silicon wafer starting material in the mid 1970's offered this possibility), the growth of defect-free epitaxial layers requires the elimination of particles on the surface of the parent substrate wafer. Unfortunately, using present day epitaxial processing technology, the elimination or substantial decrease in particulates and the associated achievement of very low particle-related defect densities are accomplished at the expense of extensive run and wafer inspection and very low wafer yields, rather than resulting from teh growth of consistently high quality epitaxial films.

In most reactors used for the growth of epitaxial silicon, the wafers are heated in one of two ways: indirect heating from an inductively heated susceptor, or direct heating in a radiant heating mode by infrared and visible radiation from a bank of tungsten-halogen lamps. FIGS. 1 and 2 show typical prior art induction heated horizontal and pancake reactors. FIG. 3 shows a radiant heated reactor, which has become the commercial system of choice for high temperature CVD processing because the more uniform heating of the wafers produces more slip-free wafers at the end of the epitaxial growth process.

The induction heated horizontal reactor system 10 shown in FIG. 1 utilizes a quartz tube 11, which has a load door 12 at one end with a gas inlet 13 therein and an exhaust port 14 at the other end. Silicon wafers 15 are supported on a susceptor 16 which is held at an angle by a quartz susceptor holder 17. Induction heating coil 18 causes heating of the susceptor wafer carrier 16, which in turn heats the silicon wafers 15 by a combination of conduction and radiation.

The same type of induction heating is performed in the vertical (pancake) reactor system 20 in FIG. 2. In this system, a quartz bell jar 21 houses a susceptor 22 on which the silicon wafers 23 are mounted. The susceptor 22 is heated by an induction coil(s) 24 which, in turn, heats the silicon wafers 23. Gaseous products used to form the epitaxial silicon layer and to dope the layer are introduced through gas inlet 25. The reaction products are exhausted from the interior of bell jar 21 through exhaust ports 26 and 27.

The radiant heating reactor 30 of FIG. 3 illustrates schematically a reactor system which is commercially available from Applied Materials, Inc. of Santa Clara, Calif. In this system, an inverted quartz bell jar 31 houses a generally cylindrical susceptor on which silicon wafers 33 are mounted. Modular banks 34 of tungsten-halogen cycle lamps surround the exterior of the quartz bell jar 31 and are powered by lamp power supply 38 for radiantly heating both the susceptor 32 and the wafers 33 mounted thereon. Gases for forming and doping the epitaxial silicon layers are provided to the interior of the bell jar 31 through gas inlet 39. A susceptor lift-rotation assembly 35 rotates the susceptor 32 within the bell jar 31 for uniform deposition of the epitaxial layer. The assembly 35 also elevates the susceptor 32 for loading and unloading the wafers 33. Reaction products are exhausted through a port 36 at the bottom of the bell jar. A cooling supply 37 is provided both for the lamp modules 34 (to increase the lifetime of the lamps) and also for the exterior walls of the quartz bell jar 31. Cooling of the quartz bell jar 31 is preferably to minimize the formation of silicon deposits on the interior walls thereof. Such deposits can later cause a particulate contamination problem, if portions flake off and become incorporated into the epitaxial layer being formed on the individual wafers.

The radiant heated reactor system 30 shown schematically in FIG. 3 has been a workhorse in the semiconductor industry for many years. In this system, the simultaneous radiant heating of both the susceptor and the wafer produces uniform heating of the wafer and slip-free silicon epitaxy. In addition, the vertical orientation of the susceptor and wafers greatly reduces particulate deposition on the wafers by gravity. This is in contrast to the horizontally oriented susceptors of the RF systems 10, FIG. 1, and 20, FIG. 2, for which gravity is a primary particle deposition mechanism.

Despite the uniform heating, low particulate contamination, slip-free performance of the radiantly heated reactor system 30, which has greatly contributed to its acceptance in the semiconductor industry, the system does have room for improvement, at least in the area of particulate-generated defects when the system is used for advanced, very small minimum feature-size IC processes. The basic problem is simply that it is virtually impossible to eliminate all sources of contaminants, such as wall deposits, in reactor systems. Thus, while the cool-wall nature of the radiantly heated reactor system 30, supplemented by air cooling of the chamber walls, substantially lowers the rate of deposition of contaminants on the interior walls of the chamber and lengthens the cleaning intervals for the chamber, it is a fact that some deposits are formed on the chamber walls and other internal chamber components during the epitaxial process. Unfortunately, the advanced, very small minimum feature size IC chips are extremely sensitive to even very low levels of particulate contamination of the wafers, and, thus, even the radiantly heated, vertically oriented, low contamination system 30 may have difficulty in consistently meeting the very high quality, very low defect density specifications of such chips at high yield levels.

Accordingly, it is the principal object of the present invention to provide a chemical epitaxial deposition process which is characterized by improved, that is, reduced, particle deposition on the parent substrate wafer or layer and on the growing epi layer.

It is another object of the present invention to provide a radiantly heated, chemical epitaxial deposition process which is characterized by a very low defect density, as well as by a very low particle-generated defect density.

It is also an object of the present invention to provide an epitaxial process which is routinely capable of meeting very low defect specifications, and which is adaptable to various types of reactors in addition to radiantly heated reactors, such as, for example, RF heated reactors.

The present invention relates to a technique for effecting the substantial reduction or elimination of particles and particle-generated defects in epitaxial layers by means of controlling the transport mechanisms which are responsible for particle deposition. Thus, in one aspect, electrostatic attraction is substantially eliminated as a transport mechanism by the selective application of a low level of radiant energy during "cold" portions of the epitaxial deposition cycle. In another aspect, static is substantially eliminated by the application of thermal energy, as by RF or electrical resistance heating. In reactors where wafers are positioned vertically, gravity is largely absent as an effective particle transport mechanism, so that the elimination of electrostatic attraction substantially eliminates particle transport and deposition on the wafer and epitaxial layer and, thus, substantially eliminates particle-generated defects.

Typically, the low level radiant energy and the thermal energy applications are accompanied by thermophoresis, which further decreases particle deposition.

In one specific application, the static-eliminating energy is applied during the so-called cold purge pre-epitaxial-deposition step(s), prior to system heat-up to the deposition temperature.

The above and other aspects of the invention are described in conjunction with the following drawings, in which:

FIGS. 1–3 schematically illustrate, respectively, horizontal, pancake and barrel reactors of the type used for epitaxial deposition; and FIGS. 4A–4C schematically illustrate the mechanism of eddy current injection.

DETAILED DESCRIPTION OF THE INVENTION

The nature of the chemical epitaxial deposition technology to which the present invention applies is well known. Therefore, only brief reference is directed here to the general concepts of epitaxial film growth. By way of introductory example, CVD chemical reaction and/or thermal pyrolysis can be used to deposit a variety of epi films, including single crystal films such as silicon, germanium, gallium arsenide and gallium arsenide phosphide films; noncrystalline films such as silicon nitride and silicon dioxide films; and metal films such as molybdenum, titanium, zirconium and aluminum films, on silicon substrates such as silicon wafers in accordance with the following reactions.

Silicon epitaxial deposition by silane, silicon tetrachloride or dichlorosilane decomposition at temperatures within the range of 900°–1200° C. occurs as follows:

$$SiH_4 \rightarrow Si + 2H_2$$

$$SiCl_4 + 2H_2 \rightarrow Si + 4HCl$$

$$SiH_2Cl_2 \rightarrow Si + 2HCl$$

Silicon nitride is deposited at temperatures in the range of 600° to 1100° C. in accordance with reactions such as the following:

$$3SiH_4 + 4NH_3 \rightarrow Si_3N_4 + 12H_2$$

$$3SiCl_4 + 4NH_3 \rightarrow Si_3N_4 + 12HCl$$

Silicon dioxide deposition from silane or silicon tetrachloride may be effected in accordance with the following reaction at temperatures of 800° to 1100° C.:

$$SiH_4 + H_2 + 2CO_2 \rightarrow SiO_2 + 3H_2 + 2CO$$
$$SiCl_4 + 2H_2 + 2CO_2 \rightarrow SiO_2 + 4HCl + 2CO$$

Silicon dioxide may be deposited from silane oxidation in the range of 300° to 500° C. as follows:

$$SiH_4 + O_2 \rightarrow SiO_2 + 2H_2$$

Also, as one example of epitaxial metal deposition, molybdenum may be deposited at temperatures in the range of 900° to 1200° C. by way of the following reaction:

$$2MoCl_5 + 5H_2 \rightarrow 2Mo + 10HCl$$

Corresponding reactions for producing other exemplary metal and non-metal films also can be employed in accordance with known procedures. The above reactions are intended as examples; alternatives will be readily apparent to those skilled in the chemical deposition art.

Figure 1:
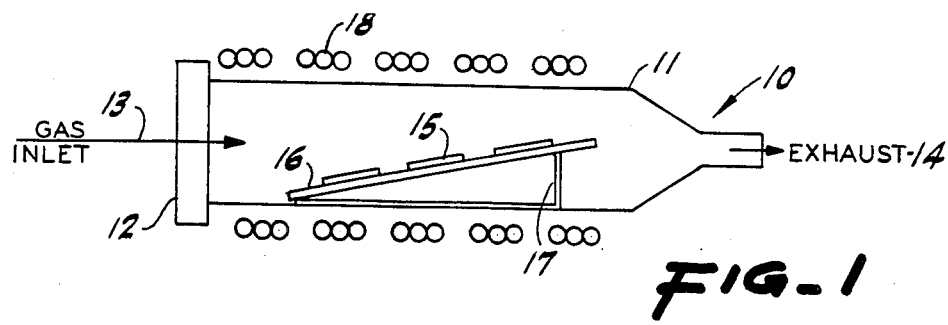
Figure 2:
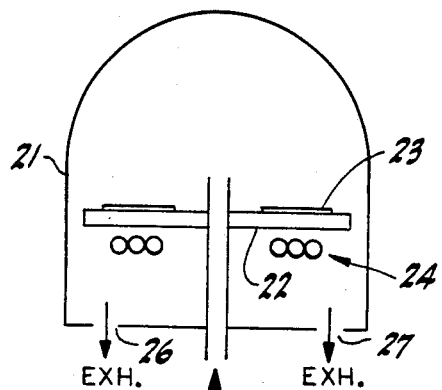

The present invention resulted from the discovery that several different transport mechanisms are or can be responsible for the deposition of particles onto wafers in epitaxial reactors, including the vertical radiant heated barrel reactor 30 (where the wafers are positioned in a nearly-vertical orientation), during a typical epitaxial deposition process utilizing the reactions described above. It turns out that barrel reactors are inherently less prone to particulate-related defects than are horizontal reactors, due to the prevailing absence of gravity particle transport to the vertically oriented wafer surfaces. In contrast, in systems where wafers are horizontally positioned such as 10, FIG. 1, and 20, FIG. 2, gravitational force is a primary mechanism in depositing particles on the wafers from the gas flow as the gas sweeps across the wafers. For vertically positioned for near-vertically positioned wafers, such as those in reactor 30, the force of gravity is substantially parallel to the wafer surface and tends to direct the particles downwardly toward the exhaust, rather than horizontally toward the wafers. Thus, gravity as an effective particle transport mechanism is virtually eliminated in vertical barrel reactors such as the reactor 30.

Furthermore, it has been determined that the dominant transport mechanism in barrel reactors such as the reactor 30 is, typically, electrostatic attraction. It has been found that static can be substantially immediately eliminated as a particle transport mechanism in the standard epitaxy process sequences used in reactors by applying low level radiant energy to the chamber during the predeposition cold purge cycles. In the reactor 30, this is accomplished without any equipment change whatsoever. In other, non-radiant reactors, the low level radiant energy capability can be supplied by the addition of supplemental, low power radiant energy sources such as, for example, tungsten-halogen lamps. Alternatively, in non-radiant reactors, such as for example RF-heated reactors, the reactor heating system can be used to apply thermal energy to eliminate the static. As described below, the invention is not at all limited to the particular reactor 30 or to a particular process sequence. Rather, particle contamination can be reduced in a wide range of horizontal and vertical epitaxial reactors by applying the understanding provided herein of the operative transport mechanisms—gravity, electrostatic attraction, eddy current injection and diffusion or Brownian movement—and the understanding of the appropriate techniques provided herein for quenching or obviating such mechanisms.

Experiments

A series of experiments were conducted which demonstrated the existence of static attraction as the dominant particle transport mechanism during atmospheric pressure operation of the reactor 30, based upon the standard process sequence listed in Table 1 and the use therein of low power radiant energy during the cold purge cycles. Table 1 summarizes a typical conventional process sequence for the radiant heated barrel reactor 30, along with examples of each cycle time of the process sequence. After loading the wafers, the reactor chamber is conditioned for the epitaxy process by applying one or more purge and evacuation steps. Here, typically the chamber is purged with nitrogen to substantially eliminate the air (and associated moisture) from the chamber (step 1), then the gas flow is switched to hydrogen to complete the purge (step 2). The hydrogen is ideal for this second step in part because it is basically "inert" relative to the semiconductor wafers and is used as the carrier gas for deposition. Both the nitrogen prepurge and hydrogen purge are carried out "cold", that is, without heating. In some cases, the nitrogen prepurge is replaced by a pumpdown (evacuation) and the hydrogen backfill/purge alone is used. This may shorten the cycle time but it worsens the potential for static generation and subsequent particle transfer thereby making it even more advantageous to use the radiant energy static kill.

TABLE 1

| Cycle | Time | |
|---|---|---|
| Load Wafers | | |
| 1. N$_2$ prepurge/N$_2$ pre-evacuation | 2-3.5 min. | ⎤ Apply low |
| 2. H$_2$ purge | 3 min. | ⎦ power here |
| 3. Heat to 850° C. | 4 min. | |
| 4. Heat to Etch Temp (1180° C.) | 4 min. | |
| 5. Etch | 2 min. | |
| 6. Cool (to 1080° C.) | 2 min. | |
| 7. Deposition | | |
| 8. Cool Down and H$_2$ Purge | 5 min. | |
| 9. N$_2$ Cycle Purge | 3 min. | |
| Unload Wafers | | |

Following the purge cycle, the hydrogen flow is maintained and the temperature of the reactor is quickly ramped to 850° C. for the purpose of temperature equilibration and low temperature bake (step 3). In those cases where the parent semiconductor wafer surface is precleaned prior to deposition, the next two steps involve heating the reactor to the desired etch temperature (step 4) and etching, for example, using HCl etchant gas (step 5), followed by ramping the reactor temperature down to the deposition temperature (step 6). Next, the deposition sequence is performed in accordance with the above listed chemical reactions (step 7). Typically, the appropriate source gas is supplied in hydrogen carrier gas flow of approximately 120 to 190 standard liters per minute (SLM). The source gases include SiH$_4$, SiH$_2$Cl$_2$, SiHCl$_3$ and SiCl$_4$. In addition, the epitaxial layer may be doped during the deposition cycle, for example, by the addition of approximately 50 parts per million (tank concentration) arsine (AsH$_3$), or phosphine ($PH_3$), or diborane ($B_2H_6$). It should be mentioned that the 1080° C. deposition temperature listed in Table 1 is typical for dichlorosilane deposition but deposition temperatures used for this and the other source gases may vary significantly according to how the deposit is being tailored to achieve the desired results. The deposition temperatures used for the other source gases may vary slightly in accordance with information provided, for example, in Applied Materials, Inc. product specification brochures entitled "AMC 7810 and 7820 Radiantly Heated Epitaxial Reactor Systems", available from Applied Materials, Inc., 2940 Kifer Road, Santa Clara, Calif. 95051. After deposition, the chamber and wafers are cooled down and purged with hydrogen (step 8), followed by a final nitrogen purge (step 9), then the reactor is ready for wafer unloading.

The experiments involved first performing a number of control runs similar to the standard process sequence of Table 1 using dichlorosilane as the source gas. A second series of runs were performed, in the identical manner as the first, except that low lamp power (six-ten percent) was applied via the radiant heating lamp modules 34 during the predeposition cold nitrogen purge (step 1) and the hydrogn purge (step 2). The associated power levels were approximately 6-12 kilowatts.

The results are tabulated in Table 2. There, site A, B, C, or D refers to the same generic type of reactor 30. Sites A and B were in fact the same reactor, whereas sites C and D involved a second and a third reactor of the generic type 30. The condition of the reactor listed in Col. 2 of Table 2 was determined in each case by running a cold particle test (three and one-half minutes of nitrogen prepurge followed by a ten minute hydrogen purge). The epitaxial silicon films were deposited according to the standard procedure and the radiation-modified procedure and the particle count per wafer and micro-defect densities were quantified with a Surfscan and differential interference contrast microscopy. That is, after the epitaxial deposition, the epitaxial layer surfaces were observed (1) for particles using a Surfscan or very bright light, and (2) for micro-defects by differential interference contrast microscopy. The particle counts are shown in Col. 3 and 4 of Table 2 for the standard or normal procedure (Std.) and for the modified procedure of this invention involving the use of low level radiation during the cold purges (Inv.). Similarly, the microdefect densities for the standard and cold purge-irradiated process sequences are shown, respectively, in Col. 5 and 6. The last column indicates the number of process runs which were done for the various reactor cleanliness conditions.

inch wafer for a very clean reactor and 0-3 particles for a dirty reactor.

Similarly, for the standard process, the micro-defect density per square centimeter ranged from $<1/cm^2$ for the very clean system, to $<2/cm^2$ for the clean system, but was an unacceptable $(25-30)/cm^2$ for the "not clean" system and $(50-80)/cm^2$ for the dirty system. In contrast, for the modified process, the micro-defect density was uniformly $<0.2/cm^2$, which is an astonishing result relative to the currently achievable defect specifications. The only instance where the micro-defect density was greater, case C, is believed to reflect a residual stacking fault count as the result of a deposition rate which was too high for the temperatures used. Nonetheless, the micro-defect density for case C was still less than one per square centimeter.

Figure 3:
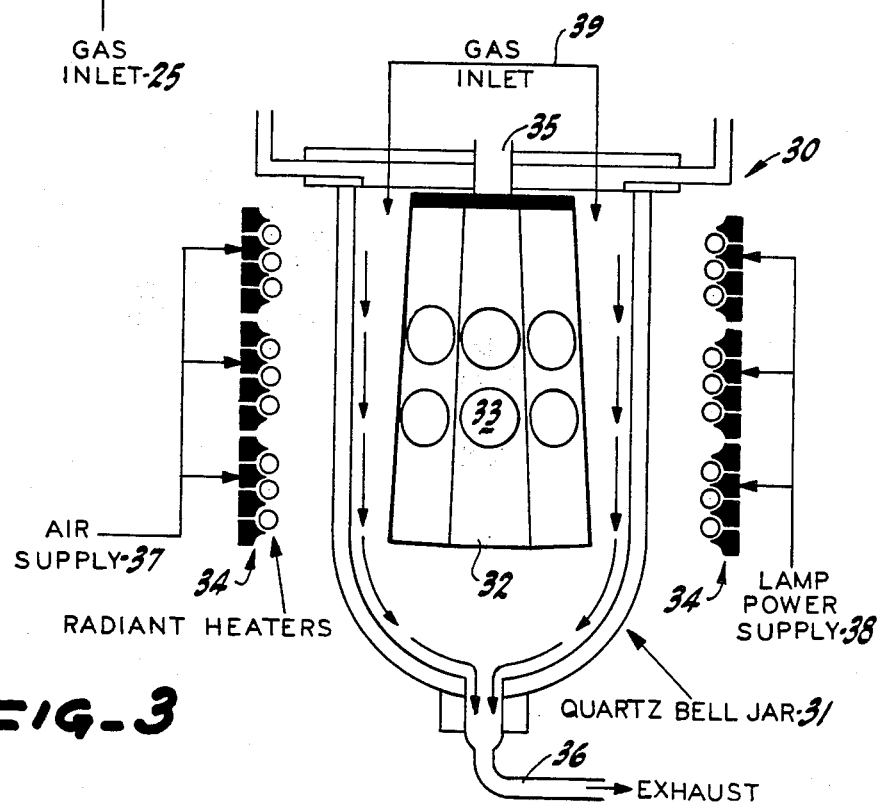

In addition to testing the effectiveness of static elimination and particle elimination in another sequence, many silicon particles were added to the reaction chamber 30 prior to testing. Silicon wafers were crushed to provide a spectrum of particles sizes from smaller than 0.8 microns to larger than 3 microns. The silicon particles were sprinkled on the top of the susceptor and in some cases on top of the quartzware above the susceptor. Particle loading was such that under normal flows but in the absence of any particle "protection" as many as 620,000 particles were observed per four-inch wafer. This very exaggerated type of testing revealed that when static was eliminated, by the application of the low level radiant energy, particle transport to the wafer surfaces (at atmospheric pressure) was also eliminated. This is taken as evidence that there exists a stagnant gas layer over the wafer, and that, in the absence of a force such as static attraction (for vertically positioned wafers) or gravity (for horizontally positioned wafers) this layer is effective in preventing particles from randomly migrating to the wafer surfaces. Therefore, the same gas flows that transport reactive gases to the wafer surfaces also transport particles. However, in the case of vertical-oriented wafers, static attraction (or some other force) is required for particle migration from the vertical gas flow (see FIG. 3) across the stagnant gas layer.

Figure 4A:
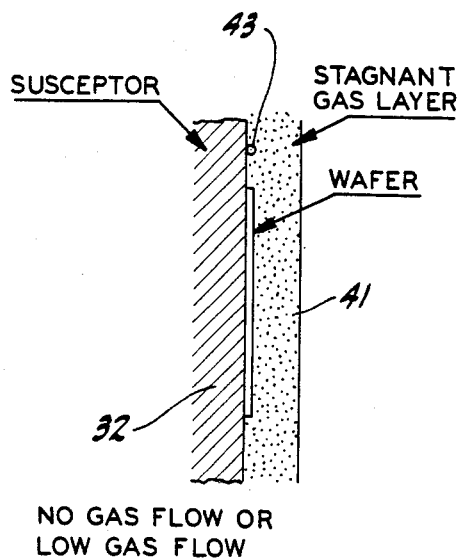

Based upon the stagnant or boundary layer model, particles which are already on the susceptor prior to epitaxy are under the stagnant gas layer and may statistically relocate to the wafer surface. (FIG. 4A.) This was shown by a series of tests, in which good results could not be obtained as the result of these particles migrating to the susceptor prior to testing. This situation can be rectified if a very thin coating of 0.2 to 0.4

TABLE 2

| USER SITE | CONDITION | PARTICLES PER 4" WAFER, AFTER EPI | | TOTAL MICRODEFECTS PER $CM^2$ (UNETCHED) | | DATA BASE, NUMBER OF FULL RUNS |
| --- | --- | --- | --- | --- | --- | --- |
| | | STD. | INV. | STD. | INV. | |
| A | VERY CLEAN | 3-6 | 0-2 | <1.0 | <0.2 | >500 |
| B | CLEAN | 7-10 | 0-2 | <2.0 | <0.2 | >500 |
| C | NOT CLEAN | 15-20 | 0-3 | 25-30 | <1.0 | 10 |
| D | "DIRTY" | 100-200 | 0-3 | 50-80 | <0.2 | 38 |

The Table 2 results speak for themselves. The particle counts for the standard process sequence range from a low of three particles per four-inch wafer for a very clean reactor up to two hundred particles per wafer for a dirty reactor. In contrast, the particle count for the modified process was between 0-2 particles per four microns of silicon is used to adhere particles to the susceptor prior to the process run.

Control of Transport Mechanisms

As mentioned previously, gravity as a particle transport mechanism is eliminated simply by using a wafer orientation which is vertical or sufficiently close to the vertical so that gravity transports particles substantially parallel to, rather than toward, the wafer surfaces. Gravity primarily affects relatively large particles, e.g., those $\geq 5\mu$ in diameter, since large particles are less affected by other types of forces. For example, in the barrel reactor 30, particles $>5\mu$ are rarely deposited on the wafers, because gravity is so effective as a vertical directed transport mechanism.

As shown above, of the non-gravity particle transport mechanisms, electrostatic attraction between charged particles and the wafer/susceptor is typically dominant. Electrostatic attraction typically is caused by locally high gas velocities (that is, tribocharging) and acts on physically small particles as well as physically large particles, probably on particles ranging up to $5\mu$ in diameter. During the use of the above outlined process sequence, electrostatic attraction is operative almost exclusively during the cold purging steps (steps 1 and 2). It is substantially non-existent when the susceptor/wafer is at an elevated temperature, such as for example above about 180° C. Since the processing steps commencing with the ramp up (step 3) are either conducted at elevated temperatures or, in the case of the end nitrogen and hydrogen purges are conducted in a reactor in which there is considerable residual heat in the susceptor and elsewhere, electrostatic attraction is substantially eliminated by thermal energy. During the cold prepurge steps, electrostatic attraction can be substantially immediately eliminated by turning on the radiant lamps to a relatively low power level of about six to ten percent. The resulting infrared photon flux instantaneously eliminates electrostatic attraction. In addition, if maintained for several minutes, perhaps ten to fifteen minutes, the associated heating of the susceptor and wafers eliminates electrostatic attraction thermally.

Figure 4B:
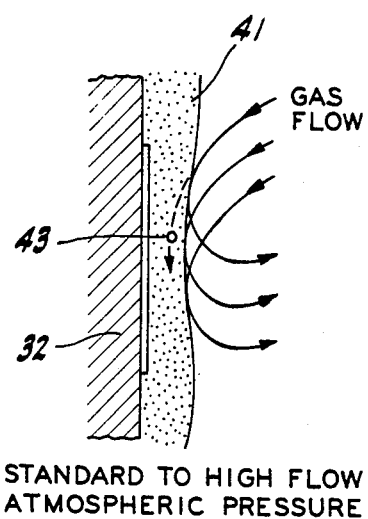
Figure 4C:
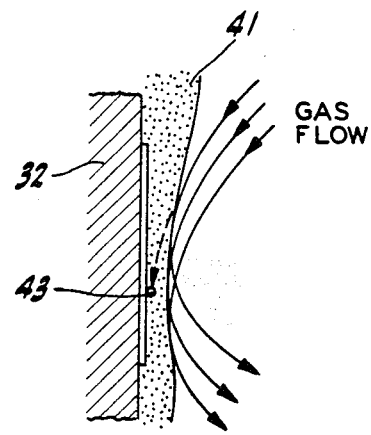

The second non-gravity transport mechanism is eddy current injection created by the process gas flow. Eddy current injection tends to increase in effectiveness as a transport mechanism as the chamber pressure is reduced and/or as the gas flow rate is increased. This is illustrated schematically in FIGS. 4A through 4C. FIG. 4A represents the condition of little or no gas flow, for which there is a relatively thick stagnant gas boundary 41 layer along the surface of the susceptor 42 and the wafer 43 protecting the wafer from whatever minimal eddy currents exist. FIG. 4B represents the conditions of the above-described experiments, i.e., the reactor 30 is at atmospheric pressure and the combined gas flow is 0 to 200 SLM. Here, the greater momentum of the individual particles 43 (as compared to FIG. 4A) is sufficient, when the gas flow path intersects the boundary layer, to carry the particle a small distance into the stagnant gas boundary layer. However, the force of gravity acting on the particle imparts a generally downward net velocity vector generally parallel to the wafer surface and ultimately away from the wafer. Finally, as shown in FIG. 4C, the pressure is reduced below atmospheric pressure, the thickness/strength of this stagnant gas boundary layer 41 decreases, with the result that the probability of particle impingement on the wafer surface increases. Also, for a given pressure, the probability of transport through the boundary layer onto the wafer surface increases with increasing flow rate. Quite obviously the effectiveness of eddy current injection is decreased as the transport mechanism and the probability of particle impingement on the wafer surface is also decreased by controlling the reactor chamber pressure (increasing the pressure increases the thickness/strength of the boundary layer) and decreasing the flow rate (to decrease the velocity and momentum of particles and thereby decrease their ability to penetrate the boundary layer).

The third non-gravity transport mechanism is that of diffusion or random Brownian-type movement (herein "diffusion" for simplicity). Transport by diffusion through the boundary layer such as 41, FIG. 4, is characterized by the random movement of small particles—usually $<0.5\mu$ in diameter—and is typically characterized by a relatively very small force or momentum which nonetheless statistically results in a percentage of wafer-directed particles which successfully traverse the boundary layer. However, since the associated momentum is small, a commensurately small counter-force is effective in eliminating this source of particle contamination. In particular, the above-described radiant energy photon flux is accompanied by thermophoresis which are individually effective in eliminating this source of particle contamination. Similarly, the application of thermal energy per se provides effective thermophoresis, beginning at lower levels than are required for killing static.

In summary, first radiant energy is effective in substantially decreasing static-transported particulate contamination and also in substantially decreasing or eliminating diffusion or random movement-related particulate contamination via thermophoresis. Also, radiant energy is believed to develop photophoresis which is thought to be an effective mechanism for countering diffusion-related particulate transport. In addition, the heating associated with the absorption of even low level radiant energy by the wafer and susceptor is effective in eliminating electrostatic attraction, although the beneficial effects require higher power and/or longer application times than are involved for radiant energy itself.

Secondly, thermal energy is effective in eliminating static. As mentioned, the energy amounts required are greater than for the radiant energy mechanism. The efficacy of thermal energy presents the possibility, where the reactor heating system is RF or electrical resistance or some other type of heating, of using the standard heating system itself to eliminate electrostatic attraction without adding supplemental radiant heating. Thermal energy also is beneficial in eliminating diffusion-related transport via thermophoresis.

Finally, while gas flow levels and pressure are usually dictated by system requirements and the type of process, knowledge of the effect of eddy currents is of help in tailoring the operation of the reactor within these constraints and will be of help in the design of future systems.

The above enhanced understanding of particle transport mechanisms is summarized in several key aspects in Table 3, and led to the subsequent formation of the processing guideline shown in Table 4 for the Model 7800 Series reactor 30. Implementation of these guidelines in actual production has enabled routine deposition of films with defect densities of less than 0.2 defects per square centimeter. In addition, armed with the above-described information concerning the various transport mechanisms and the protective gas boundary layer, those of usual skill in the art will readily tailor the parameters for a particular process and reactor to provide optimized low defect density epitaxial deposition, and will readily incorporate advantageous design and process features into new reactor designs and epitaxial process sequences based upon the knowledge of these transport mechanisms and the gas boundary layer.

TABLE 3

PARTICLE TRANSPORT MECHANISMS

| MECHANISMS | COMMENTS |
|---|---|
| Static | Effective on smaller particles Eliminated by reduced gas flow velocity[1] or use of low power |
| Gravity | More effective on larger particles Moves particle parallel to wafer surface in barrel-type systems |
| Stagnant Layer Penetration (Eddy Current Transport) | Effective at reduced pressures and higher gas velocities Eliminated by proper choice of pressure and flow source |
| No Stagnant Layer Protection | Effective at pressures less than 10 torr Eliminated by remaining in proper operating range Also a factor if particles are already under stagnant layer |

[1]Reducing the gas flow velocity would significantly lengthen the process cycle and therefore significantly reduce throughput.

TABLE 4

PARTICLE ELIMINATION GUIDELINES
(For Radiantly Heated Barrels at
Atmospheric Operating Pressures)

| MODE OR OPERATION | COMMENTS |
|---|---|
| Idle Mode | No problem. |
| $N_2$ Prepurge[1] | Use low level power. |
| $N_2$ Preevacuation[2] | Use low level power. Pumpdown is not a problem in itself, but stagnant layer protection degrades rapidly below 20 torr. |
| $H_2$ Evacuation[2] | Pumpdown only to 20 torr. Keep jets off or at minimum during backfill. Decrease backfill rate or increase ultimate pressure if problems arise. |
| $H_2$ Purge[1] | Use low level power. |
| During Heated Portion of Cycle | No restraints on jet or rotation flow while power is applied. |
| Postpurge | No restraints while susceptor is still hot or very warm. Avoid long cooldown. Normally used times and flows are fine. |
| General | High local gas velocity will generate static if low power is not used. For a given flow rate: |
| | $N_2$ flow worse than $H_2$ flow Jet flow worse than rotation flow |

[1]Prepurge and purge involve gas flow at atmospheric pressure.
[2]Preevacuation and evacuation involve a pumpdown and gas backfill.

Thus, while various embodiments of this invention have been described above, it should be understood that modifications will be made by persons of skill in the art without departing from the scope of the invention as claimed in the following claims:

I claim:

1. In a cold purge process for preparing a reactor chamber for the gas phase formation of an epitaxial layer on a wafer positioned within the reactor chamber by communicating a flow of conditioning gas into the reactor chamber, the reactor chamber system including radiant energy lamp means for heating the chamber to effect said gas phase processing, the improvement comprising: during said gas flow step, operating the radiant energy lamp means at a power level below that used for said gas phase processing heating to supply radiant energy at a relatively low flux intensity to substantially eliminate static-induced particle transport to the wafer.

2. In a cold purge process for conditioning a semiconductor reactor chamber for gas phase processing of a wafer therein prior to heating the wafer for the gas phase processing by flowing at least one purging gas through the chamber, the reactor chamber system including radiant energy lamp means for effecting said heating for gas phase processing, the improvement comprising: during said purging step, operating the radiant energy lamp means at a power level less than that used for said gas phase processing heating to supply a relatively low level intensity of radiant energy flux for decreasing electrostatic attraction between the wafer and particulates.

3. The improved cold purge conditioning process of claim 1 or 2, further comprising: orienting the wafer substantially vertically within the reactor chamber.

4. An improved purge process for conditioning a cold semiconductor reactor chamber for gas phase processing of a wafer therein prior to heating the wafer for the gas phase processing, comprising flowing at least one purging gas through the chamber and, during said purging step, heating the wafer to a temperature between about 180° C. and below said gas phase processing temperature, for decreasing electrostatic attraction between the wafer and particulates.

5. The process of claim 2 or 4 wherein the flow rate of said purging gas is selected to decrease electrostatic attraction.

6. The process of claim 2 or 4 wherein the gas flow rate and chamber pressure are selected to decrease eddy current injection.

7. The process of claim 2 or 4 wherein the wafer is oriented substantially vertically.

8. In a cold purge process for conditioning a gas phase reactor chamber and a wafer therein for deposition of a layer on the wafer using a gas phase deposition process, the reactor chamber including radiant energy lamp means for heating the wafer to effect said deposition, the improvement comprising
first, communicating at least one gas into the chamber for purging air from the chamber;
second, communicating a carrier gas into the chamber preparatory to initiation of the gas phase deposition process; and
third, during at least said second gas flow step operating the radiant energy lamp means at a power level below that used for said gas phase processing heating to supply radiant energy at a relatively low intensity level for decreasing the number of particles deposited on the wafer.

9. The process of claim 8 wherein the low intensity radiant energy is also applied during the first gas flow step.

10. The process of claim 9 further comprising, using a heating source, heating the wafer during the first and second gas flow steps to a temperature between about 180° C. and below the epitaxial deposition temperature to further decrease particle deposition on the wafer.

11. The process of claim 9 further comprising, using a second heating source, heating the wafer during at least said second gas flow step to a temperature between 180° C. and below the epitaxial deposition temperature to further decrease particle deposition on the wafer.

12. The process of claim 11 wherein the heating source is an RF heating source.

13. The process of claim 11 wherein the heating source is an electric resistance heating source.

14. An improved predeposition cold purge sequence for preparing a gas phase reactor for gas phase epitaxial growth of a layer on a wafer positioned in the reactor, the reactor chamber system including radiant energy lamp means for effecting said heating for gas phase processing, the improvement comprising: orienting the wafer substantially vertically within the reactor; passing nitrogen gas through the reactor for the purpose of purging air from the reactor; passing hydrogen gas through the reactor for the purpose of purging air from the reactor and stabilizing the hydrogen gas flow through the reactor; and throughout said gas flow steps operating the radiant energy lamp means at a power level below that used for said gas phase processing heating to supply relatively low intensity infrared radiant energy to the chamber to substantially eliminate the electrostatic attraction-induced deposition of particles onto the wafer.

15. An improved low particulate gas phase process for depositing a layer on a wafer within an initially cold reactor chamber at a suitable wafer temperature, comprising first, communicating at least one gas into the chamber for purging air from the chamber;

second, communicating a carrier gas into the chamber preparatory to initiation of the deposition process;

third, heating the wafer throughout at least said second gas flow step to a temperature between about 180° C. and below said deposition temperature for substantially eliminating electrostatic attraction between the wafer and particulates; and fourth, heating the wafer to said deposition temperature and supplying reactant gas to said chamber for depositing said layer thereon.

16. The process of claim 15 wherein the temperature during said third, heating step is about 180° C.

17. In a gas phase process for depositing a layer on a wafer within an initially cold reactor chamber at a suitable wafer temperature, the reactor chamber system including radiant energy lamp means for effecting said heating for gas phase processing, the improvement comprising first, communicating at least one gas into the chamber for purging air from the chamber;

second, communicating a carrier gas into the chamber preparatory to initiation of the deposition process;

third, operating the radiant energy lamp means at a power level below that used for said gas phase processing heating to supply radiant energy to the chamber at an intensity level substantially below that required to heat the wafer to said deposition temperature for substantially eliminating electrostatic attraction between the wafer and particulates; and fourth, heating the wafer to said deposition temperature and supplying reactant gas to said chamber for depositing said layer thereon.

18. The process of claim 17 wherein said deposition temperature is about 1100° C.

19. In an improved cold purge process for preparing a reactor chamber system for the gas phase deposition of an epitaxial layer on a wafer positioned within the reactor chamber system, the reactor chamber system including means for heating the wafer to effect the epitaxial deposition, the improvement comprising: including in the reactor system supplemental radiant energy lamp means for heating the chamber; communicating a flow of conditioning gas into the rector chamber; and, during said gas flow step operating at least the radiant energy lamp means at a power level selected to decrease electrostatic attraction between the wafer and particles without heating the wafer to the deposition temperature.

* * * * *